(12) United States Patent
Heming

(10) Patent No.: US 9,097,806 B2
(45) Date of Patent: Aug. 4, 2015

(54) PREAMPLIFIER FOR CHARGED PARTICLE DETECTION

(71) Applicant: Thermo Fisher Scientific (Bremen) GmbH, Bremen (DE)

(72) Inventor: Richard Heming, Altenberge (DE)

(73) Assignee: Thermo Fisher Scientific (Bremen) GmbH, Bremen (DE)

( * ) Notice: Subject to any disclaimer, the term of this patent is extended or adjusted under 35 U.S.C. 154(b) by 0 days.

(21) Appl. No.: 14/221,734

(22) Filed: Mar. 21, 2014

(65) Prior Publication Data

US 2014/0284493 A1    Sep. 25, 2014

(30) Foreign Application Priority Data

Mar. 21, 2013   (GB) .................................. 1305207.1

(51) Int. Cl.
| | | |
|---|---|---|
| *G01T 1/00* | (2006.01) | |
| *G01T 1/17* | (2006.01) | |
| *H04N 5/32* | (2006.01) | |
| *H03F 3/45* | (2006.01) | |
| *H01J 49/02* | (2006.01) | |

(52) U.S. Cl.
CPC . *G01T 1/17* (2013.01); *H01J 49/02* (2013.01); *H03F 3/45475* (2013.01); *H04N 5/32* (2013.01); *H03F 2200/261* (2013.01); *H03F 2200/534* (2013.01); *H03F 2203/45512* (2013.01); *H03F 2203/45518* (2013.01); *H03F 2203/45528* (2013.01); *H03F 2203/45594* (2013.01); *H03F 2203/45621* (2013.01)

(58) Field of Classification Search
USPC .............................................. 250/395, 336.1
See application file for complete search history.

(56) References Cited

U.S. PATENT DOCUMENTS

| | | | |
|---|---|---|---|
| 3,128,744 A * | 4/1964 | Jefferts et al. ................. | 119/215 |
| 3,496,463 A * | 2/1970 | Johnston et al. ............. | 324/71.1 |
| 5,872,363 A | 2/1999 | Bingham et al. | |
| 6,347,288 B1 * | 2/2002 | Trammell et al. ............. | 702/107 |
| 2008/0154529 A1 * | 6/2008 | Jordanov ...................... | 702/104 |
| 2008/0215267 A1 * | 9/2008 | Eglin et al. ..................... | 702/66 |
| 2009/0230297 A1 * | 9/2009 | Mizutani ...................... | 250/281 |
| 2010/0033231 A1 * | 2/2010 | Quesada et al. .............. | 327/509 |

FOREIGN PATENT DOCUMENTS

| | | |
|---|---|---|
| AT | 399405 | 5/1995 |
| GB | 2 204 697 A | 11/1988 |
| JP | 64-016014 A | 1/1989 |
| WO | WO 2010/023706 A1 | 3/2010 |

* cited by examiner

*Primary Examiner* — David J Makiya
*Assistant Examiner* — Taeho Jo
(74) *Attorney, Agent, or Firm* — Charles B. Katz

(57) ABSTRACT

A preamplifier is provided for correction of overshoot or undershoot effects present in a signal received from a charged particle detection electrode. The preamplifier is ground-isolated from the charged particle detection electrode and comprises: a main amplification stage, configured to receive and amplify the isolated signal; a feed-forward stage, configured to generate a compensation signal from the amplified ground-isolated signal, the compensation signal being generated to mirror the overshoot or undershoot effects; and an output, arranged to provide an output signal that is a combination of the amplified ground-isolated signal and the compensation signal. A charged particle detection arrangement comprising the preamplifier is also provided.

15 Claims, 5 Drawing Sheets

PREAMPLIFIER FOR CHARGED PARTICLE DETECTION

FIELD OF THE INVENTION

The invention relates generally to a preamplifier for a charged particle (especially ion) detection arrangement, and more particularly to a preamplifier adapted for correction of either overshoot or undershoot effects present in a signal received from a charged particle detection electrode.

BACKGROUND TO THE INVENTION

A detector of charged particles, such as a photomultiplier (PM) or a secondary electron multiplier (SEM) is typically used in instruments such as a mass spectrometer. These detectors offer ground-referenced electrical pulse signals (which are termed "events"), which may float on a high voltage reference (as high as 2 kV) and are normally of negative polarity due to the charge of electrons. In a mass spectrometer, such detection signals can then be used to create a mass spectrum (indicating the relative abundance of ions of different masses), for example by counting the number of events received within a discrete period of time. Improving the detection accuracy and discrimination of events therefore provides a higher quality mass spectrum.

The detected pulses can have durations of several nanoseconds. Where the duration of a pulse is in the range of 5 ns to 20 ns, these coincide with noise and interference from bursts on the mains power supply, radio and digital bus signals in the frequency domain. To reduce this interference problem, the output of the detection electrode can be ground-isolated, for example by use of a signal transformer. This mitigates the problem of DC and low frequency AC interference on the ground loop and can offer a significant improvement in Signal-to-Noise Ratio (SNR) of the measured signal.

The use of a transformer can have further advantages, in that polarities can be changed and impedances can be matched. Moreover, a transformer can act to filter out noise and interference that lie in the stop-band of the device. This may enhance signal quality.

However, such arrangements can also have difficulties. The pulse signals originating from the detection electrode are short transients. This means that the isolated signal, especially when generated using a transformer, can comprise additional artefacts. In particular, the transient part of the pulse can comprise an additional over-shoot or under-shoot, not present in the original signal. As a flux-coupled transformer can only pass AC signals, this kind of distortion may be created in the isolated signal.

Such distortion means that the pulse duration is made less distinct. Not only does this reduce the precision of any mass spectrum generated using this signal, but this distortion can also mask an immediately adjacent pulse and therefore make it difficult to distinguish pulses. Improving the quality of the detector output signal is therefore a challenge.

SUMMARY OF THE INVENTION

Against this background, the present invention provides a preamplifier for correction of either overshoot or undershoot effects present in a signal received from a charged particle detection electrode. The preamplifier is ground-isolated from the charged particle detection electrode. The preamplifier comprises: a main amplification stage, configured to receive and amplify the isolated signal; a feed-forward stage, configured to generate a compensation signal from the amplified isolated signal; and an output, arranged to provide an output signal that is a combination of the amplified isolated signal and the compensation signal. The compensation signal is generated to mirror the overshoot (or undershoot) effects. If the isolated signal comprises a negative pulse, overshoot may be present and if the isolated signal comprises a positive pulse, undershoot may be present.

This preamplifier uses the feed-forward stage to provide compensation for the artefacts that are introduced into the isolated signal, especially when that signal is generated using a transformer. By generating a compensation signal that mirrors the overshoot or undershoot effects and therefore creates pulse shaping, this distortion is removed after the main amplification. The compensation signal may be a proportional modified copy of the isolated signal from the detection electrode. Advantageously, the feed-forward stage takes an amplified version of the isolated signal as its input, rather than the isolated signal itself. This means that weak signals are amplified before compensation and makes it easier to discriminate (in a subsequent stage) between overshoot or undershoot effects and weak pulses. Moreover, the main amplification stage may be used to provide inherent stability to the preamplifier. This may thereby avoid any condition or state leading to oscillation, possibly due to superimposing the compensation signal on the amplified isolated signal.

As the feed-forward stage uses an amplified version of the instantaneous isolated signal, the compensation signal is generated for any height and duration of pulse in the isolated signal. The preamplifier may therefore be capable of handling different heights of signal variation of almost 40 dB in range. Also, the compensation signal may be generated for pulse durations as low as 3 ns to over 40 ns.

In the preferred embodiment, the preamplifier further comprises an input stage. This may be configured to receive a detection signal from the charged particle detection electrode and to ground-isolate the preamplifier from the charged particle detection electrode. This may generate the isolated signal from the received detection signal. Preferably, the input stage comprises a transformer. The transformer beneficially comprises a primary winding arranged to receive a detection signal and a secondary winding inductively coupled to the primary winding. The secondary winding is preferably arranged to provide the isolated signal. The transformer may thereby ground-isolate the preamplifier from the charged particle detection electrode. The transformer advantageously creates a isolated signal from the detection signal. An alternative to the transformer may comprise a capacitor. However, such devices may also be responsible for introducing the overshoot or undershoot effects that the preamplifier is intended to correct. The transformer may further act as a low pass filter. Beneficially, the input stage may further comprise a resistance connected across the secondary winding of the transformer. This resistance may be configured to provide a voltage signal at the output of the input stage.

The transformer may used in voltage-mode with a slightly higher resistance on its secondary winding than the resistance for which its characteristic impedance is designed. In such cases, it may be possible to obtain a higher degree of voltage gain due to the received electrons and their current supplied by the detector arrangement, such as an SEM. The inherent input capacitance of the transformer may be usable when the outputs of the transformer are not virtually-grounded by the input amplifier. Therefore the transformer may act as a passive component signal filter while isolating the amplifier ground from the detection electrode ground.

In the preferred embodiment, the main amplification stage comprises a non-inverting amplifier configuration. This may comprise an operational amplifier with the isolated signal provided to its non-inverting input, a first resistance coupled between its inverting input and a reference voltage and a second resistance coupled between its output and its inverting input. Beneficially, a capacitance may also be provided between the output of the operational amplifier and its inverting input. This may provide stability, in particular to compensate for a phase margin of the operational amplifier.

Advantageously, the isolated signal comprises a pulse. Then, the feed-forward stage may be configured to generate the compensation signal in proportionality to a magnitude and width of the pulse. In particular, the feed-forward stage and the output may be configured to provide the output signal such that it comprises a pulse corresponding with the pulse of the isolated signal. Then, the pulse of the output signal may be substantially no wider than the pulse of the isolated signal. Widening the pulse may cause any adjacent pulses to be less discernable. Moreover, it may increase the complexity of the apparatus (logic) used to generate the mass spectrum and compensate for "dead time" of the mass spectrometer.

Preferably, the feed-forward stage comprises an integrator. More preferably, the integrator is an integrative signal-shaping circuit. This may be configured to receive the amplified isolated signal (from the main amplification stage) and to generate an integration signal. The integration signal may be generated by integrating the amplified isolated signal over time. Equivalently, the integrator may be a form of low-pass filter. This may use a capacitance.

Beneficially, the integrator (integrative signal-shaping circuit) is further configured to comprise an additional decay component. The decay component may create an exponential tailing effect that is quite long compared to the rise time of the integrator. Advantageously, the additional decay component comprises one or more diodes, beneficially forward-biased. Optionally, the one or more diodes comprise a silicon diode and preferably a PIN diode. The PIN diode may create the exponential tailing effect noted above, although other diodes may be used alternatively. In the preferred embodiment, the integrator comprises an amplifier with negative feedback, particularly an inverting amplifier. The capacitance and the decay component are beneficially provided in the feedback loop. The capacitance provides the integration (low-pass filtering) effect. This may further smooth the output signal and lower noise due to interference.

Advantageously, the integrator comprises an operational amplifier in an inverting configuration. This may mean that the non-inverting input of the operational amplifier is coupled to a reference voltage. Moreover, the inverting input of the operational amplifier is coupled to the amplified isolated signal (output from the main amplification stage) via a resistance. The feedback is provided by coupling the output of the operational amplifier to the inverting input through the decay component and a capacitance. Beneficially, the capacitor and decay component are arranged to provide negative feedback to the operational amplifier.

In the preferred embodiment, the feed-forward stage may further comprise an inverting amplifier. This may be arranged to receive the integration signal and to generate the compensation signal by amplification of the integration signal. This may be used to control the magnitude of the compensation signal. Such a configuration may comprise an operational amplifier, arranged to receive the integration signal (from the integrator) at its inverting input through a resistance. The non-inverting input may be coupled to the reference voltage. Then, the output of the operational amplifier may be coupled to the inverting input via a second resistance. A capacitance may be provided between the output of the integrator stage and the input to the inverting amplifier stage. This may be used to remove DC from the integration signal.

The compensated isolated signal may be generated by the combination, specifically superposition, of the amplified isolated signal and the compensation signal. Preferably, the output of the preamplifier comprises a summing junction, configured to receive the amplified isolated signal through a first resistance, to receive the compensation signal through a second resistance and to provide the output signal by summing the received signals. Advantageously, the first and second resistances are selected in order to cause the summation of the amplified isolated signal and the compensation signal to correct the overshoot or undershoot effects present in the isolated signal.

Beneficially, the preamplifier output may further comprise an output port. This may be arranged to provide the output signal through a capacitance. Thus, the output of the summing junction may be coupled to the output port through a capacitance. A ground reference may also be provided at the output port.

In the preferred embodiment, the isolated signal is referenced to a non-zero DC voltage, preferably 2.5V. This may be the reference voltage noted above, to which the first resistance of the main amplification stage is coupled and to which the non-inverting inputs of the integrator stage operational amplifier and inverting amplification stage operational amplifier are coupled.

In a further aspect, the present invention may provide a charged particle detection arrangement, comprising: a charged particle detection electrode, arranged to provide a detection signal; and the preamplifier as described herein, configured correct the detection signal for the overshoot or undershoot effects. The charged particle detection electrode may form part of a photomultiplier or secondary electron multiplier detector. The present invention may also be found in a mass spectrometer comprising such a charged particle detection arrangement. The invention may be especially applicable to sector field instruments.

In another aspect, there is provided a method for correction of overshoot or undershoot effects present in a isolated signal received from a charged particle detection electrode at a ground-isolated preamplifier (that is, the preamplifier is ground isolated from the charged particle detection electrode). The method comprises: amplifying the isolated signal; generating a compensation signal from the amplified isolated signal to mirror the overshoot or undershoot effects; and combining the amplified isolated signal and the compensation signal in order to provide an output signal that is corrected for the overshoot or undershoot effects.

It would be understood that this method aspect can optionally comprise steps or features used to carry out any of the actions described in connection with the preamplifier detailed above. Moreover, any combination of the individual apparatus features or method features described may be implemented, even though not explicitly disclosed.

BRIEF DESCRIPTION OF THE DRAWINGS

The invention may be put into practice in various ways, one of which will now be described by way of example only and with reference to the accompanying drawings in which.

DETAILED DESCRIPTION OF A PREFERRED EMBODIMENT

Figure 1:
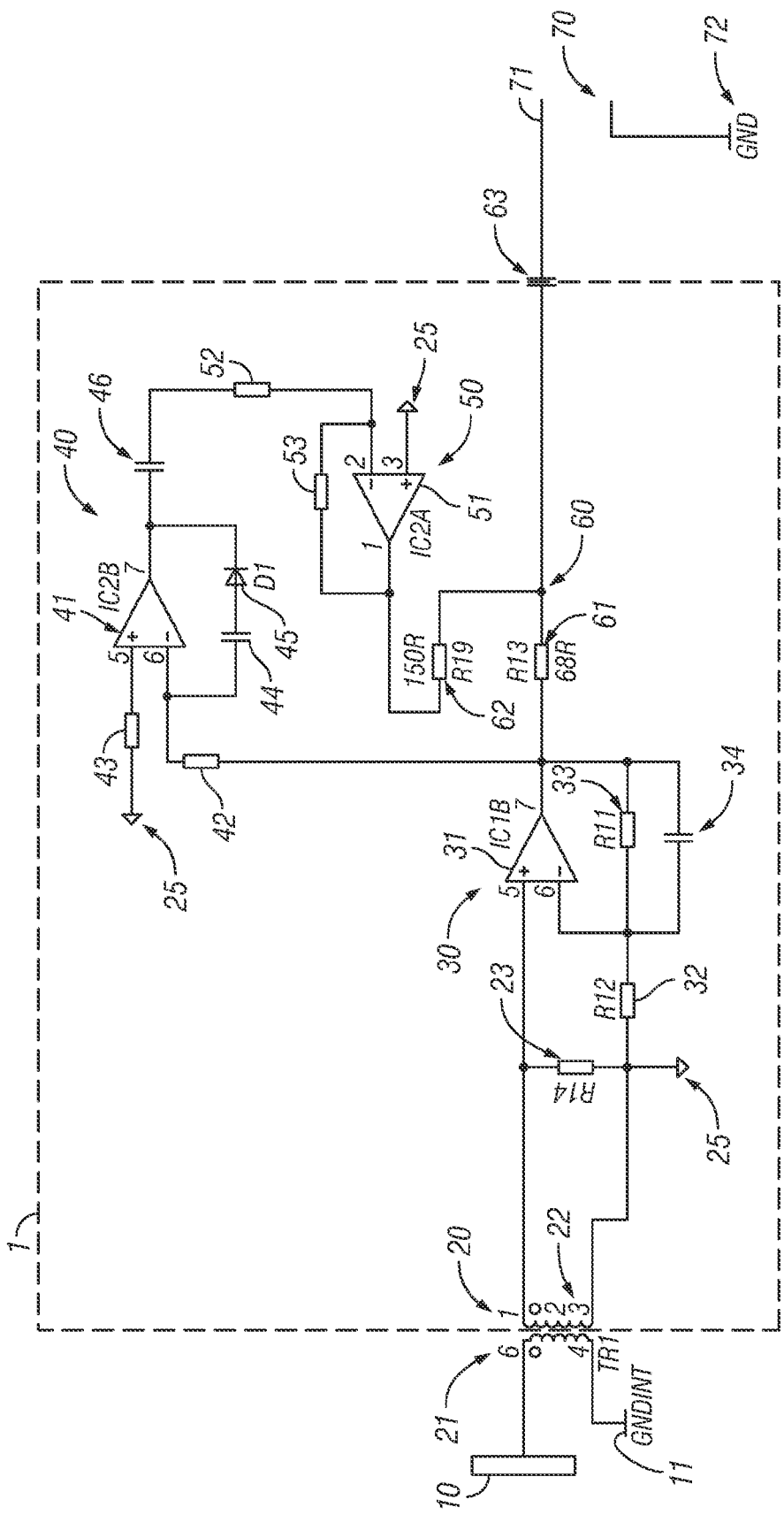
FIG. 1 shows a circuit diagram of a preamplifier in accordance with the present invention.

Referring first to FIG. 1, there is shown a circuit diagram of a preamplifier 1 in accordance with the present invention. The preamplifier receives a detection signal from a detection electrode 10. The detection electrode is referenced to a ground 11. The detection signal is provided as an input to the preamplifier 1 through a transformer 20. The preamplifier 1 comprises: a main amplification stage 30; an integrator stage 40; an inverting amplifier 50; and an output stage 60. An output port 70 is also provided.

The detection electrode 10 is a plate in a vacuum, where a cloud of electrons is absorbed. In view of the inherent negative charge, a negative pulse of finite duration is formed. This signal is applied across the primary winding 21 of the transformer 20. A secondary winding 22 is inductively coupled to the primary winding 21 in the transformer 20 and the non-DC component of the detection signal applied across the primary winding 21 causes a voltage to form across an input resistance 23. The input resistance 23 is referenced to an internal DC reference voltage 25, which has an offset of approximately 2.5 volts. Thus, the signal across the input resistance 23 has a DC offset at this voltage. The transformer 20 has a lower cut-off frequency of about 10 kHz.

The main amplification stage 30 comprises: an operational amplifier 31, which is connected in a non-inverting configuration; a first resistance 32 connected between the reference voltage 25 and the inverting input of the operational amplifier 31; second resistance 33 connected between the output of the operational amplifier 31 and the inverting input of the operational amplifier 31. A capacitor 34 is also connected between the output of the operational amplifier 31 and its inverting input to improve stability of the amplification stage. This main amplification stage 30 is intended to have a gain of approximately 5.

The feed-forward stage of the preamplifier 1 comprises the integrator stage 40 and the inverting amplifier stage 50. The integrator stage 40 comprises: an operational amplifier 41; a first resistance 42; a second resistance 43; a capacitor 44; and a PIN diode 45. The integrator stage 40 is an amplification stage, but works in principle like an integrator with a PIN diode 45 in its feedback. The PIN diode 45 provides an additional decay effect and is forward biased during the duration of the falling time of the pulse. The properties of the PIN diode 45 mean that it acts as a resistance during this duration. Together with the feedback capacity of the integrator, the resultant current at the output has an exponential tail that is quite long compared to the rise time of the output. The PIN diode 45 was experimentally found to provide better performance than other diodes, although these may alternatively be used. The output of the integrator stage 40 is passed to the inverting amplifier stage 50 via a capacitor 46.

The inverting amplifier stage 50 acts to reverse the phase of the output from the integrator stage 40. The inverting amplifier stage 50 comprises: an operational amplifier 51; a first resistance 52; a second resistance 53. In the preferred embodiment, the values of the first resistance 52 and the second resistance 53 are set to cause the inverting amplifier stage 50 to have a magnitude gain of less than 1 (that is, to attenuate the magnitude of the integration signal). The non-inverting input of the operational amplifier 51 is connected to the reference voltage 25. The output from the integrator stage 40 is coupled to the inverting input of the operational amplifier 51 through the first resistance 52. Feedback is provided by the second resistance 53 connected between the output of the operational amplifier 51 and its inverting input.

The output stage 60 comprises: a first resistance 61; and a second resistance 62. The output from the main amplification stage 30 is coupled to the output 60 through the first resistance 61. The output from the inverting amplification stage 50 is coupled to the output 60 through the second resistance 62. The two signals are summed at a junction and provided to the output port 70 through a capacitance 63. The first resistance 61 and second resistance 62 are selected to weight the two signals that are combined at the output. The output port 70 comprises two terminals: a signal terminal 71; and a ground terminal 72. The ground terminal 72 is isolated therefore from the input ground 11 and from the reference voltage 25. The DC offset caused by the reference voltage 25 is removed through capacitance 63.

Figure 2:
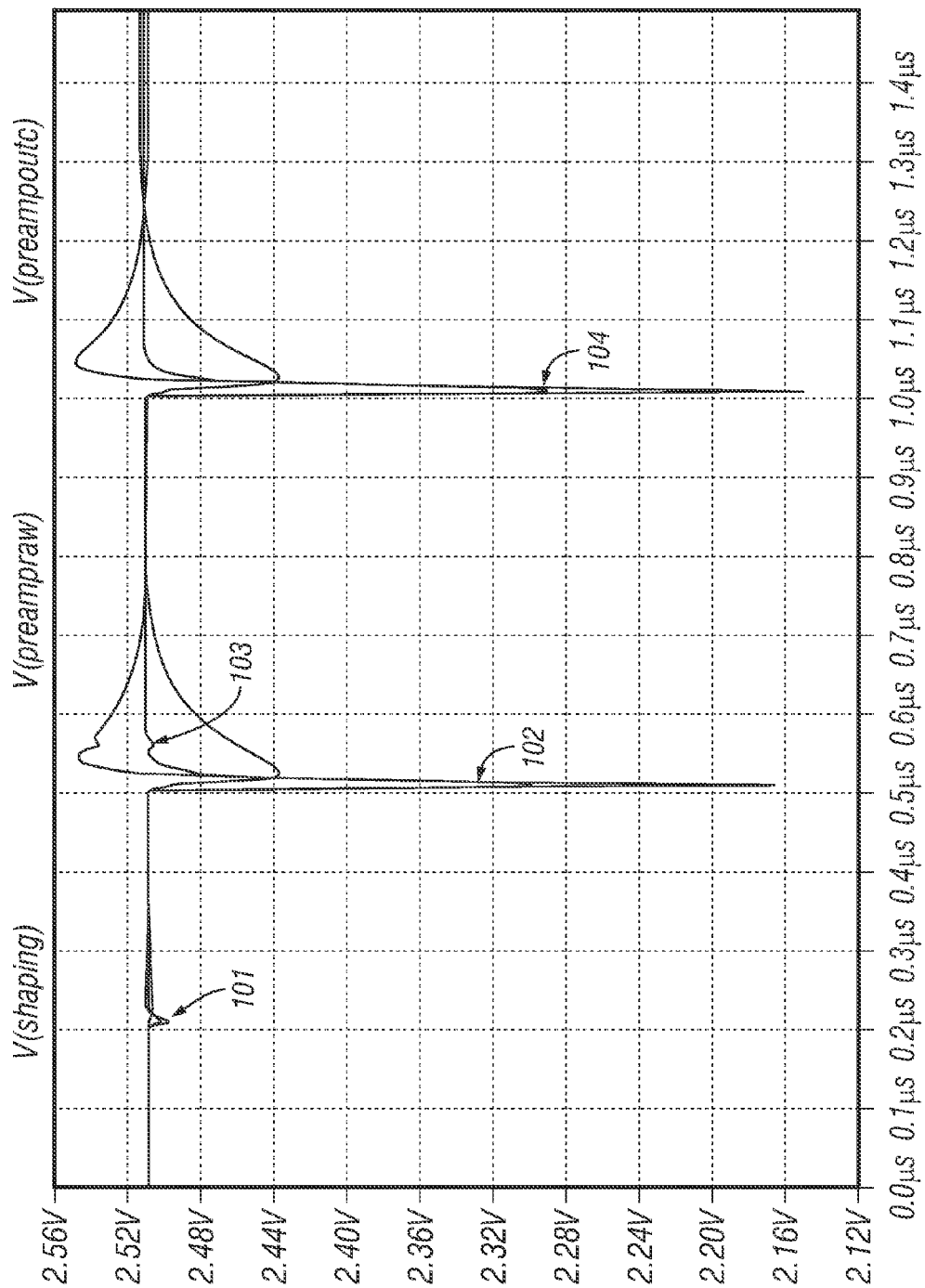
FIG. 2 depicts example waveforms of signals from within a simulated preamplifier in accordance with FIG. 1.

Referring next to FIG. 2, there is shown a depiction of example waveforms for signals in a simulation of the preamplifier shown in FIG. 1. A first signal, V(preampraw) is the output from the main amplification stage 30. This is the topmost signal shown. A second signal, V(shaping), is the output from the inverting amplification stage 50. This is the lowest signal shown. Finally, a third signal, V(preampoutc), is the output of the preamplifier, through the weighted summation of the other two signals. This is shown intermediate the other two signals.

Identified on FIG. 2 are four events, each of which is a specific detection signal resulting in a pulse waveform from the detection electrode 10. The first event 101 occurs at around 0.22 μs, the second event 102 occurs at around 0.5 μs, the third event 103 occurs at around 0.56 μs and the fourth event 104 occurs at approximately 1.02 μs.

Figure 3:
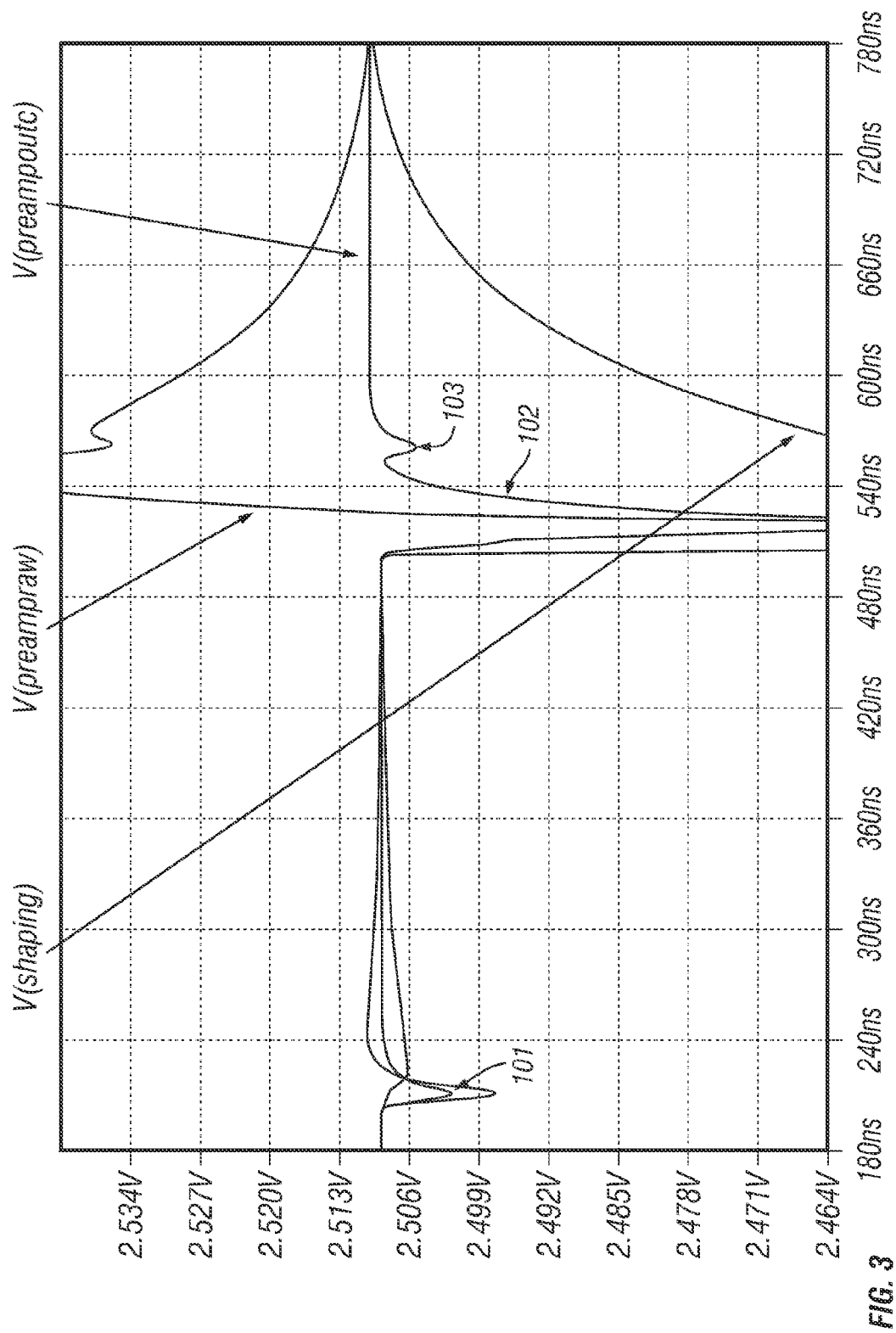
FIG. 3 shows an expanded portion of the waveforms shown in FIG. 2.

Referring next to FIG. 3, there is shown a magnified portion of the waveforms of FIG. 2. The individual waveforms are also identified more clearly on this drawing. As will be seen particularly for the second event 102 and third event 103, the compensation signal (which is the output of the inverting amplifier 50) mirrors the overshoot event in the output of the main amplification stage 30. This overshoot effect means that the third event 103 is largely indiscernible from the second event 102. However, once the main amplification stage output and compensation signal have been combined, it will be clear that the third event 103 can be distinctly observed in comparison with the second event 102.

It will further be noted that the effect of the compensation signal (labelled V(shaping)) on the output does not widen the pulse (that is, increase the pulse width or time duration, thereby slowing the pulse) with reference to the output from the main amplification stage 30 (labelled V(preampraw)). Widening the pulse increases the "dead time" of the mass spectrometer. Corrections can be applied to the mass spectrum, using statistical analysis to correct for the dead time. However, as the dead time is reduced, the corrections needed become less complex.

Figure 4:
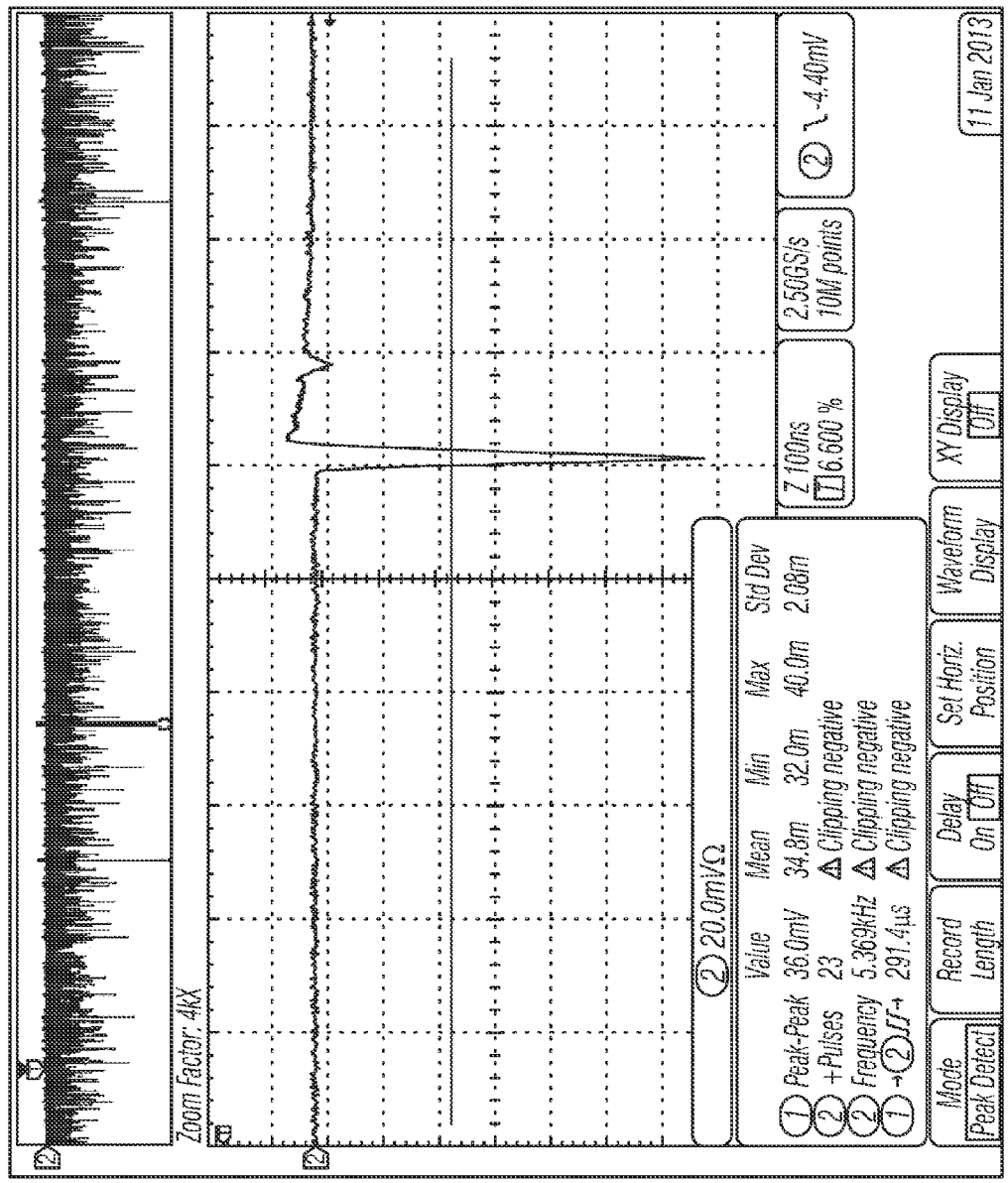
FIG. 4 illustrates an exemplary output from a known real amplifier following receipt of a detection signal, showing the effects of an overshoot artefact.

Referring now to FIG. 4, there is shown an example output from a known real preamplifier, provided by experimentation. The output is in response to an SEM event. Although optimised without any correction schemes, the overshoot after the main negative pulse is clearly observable. This is caused by the ground-isolation component, which in this case is a transformer.

Figure 5:
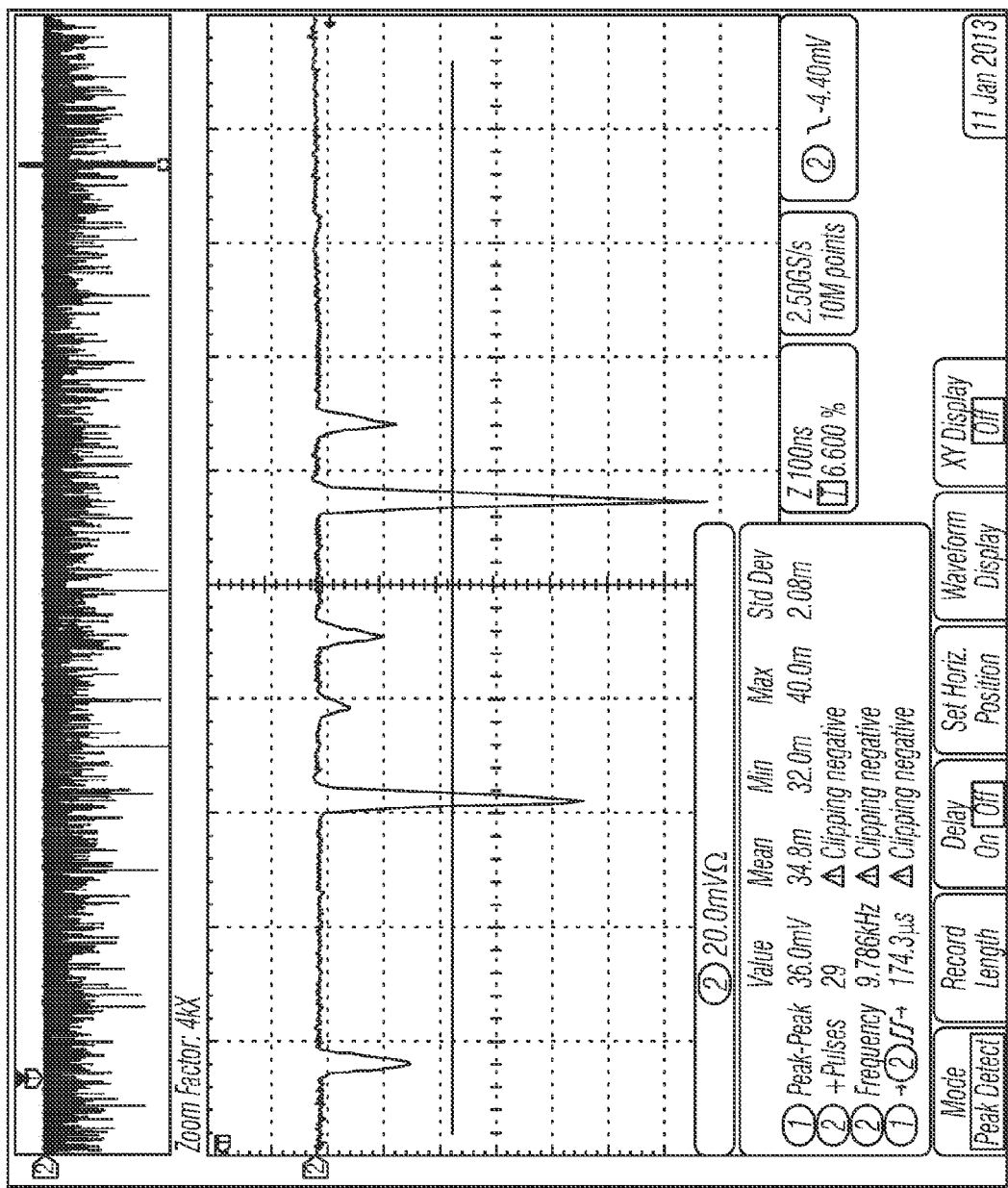
FIG. 5 illustrates an exemplary output of a real preamplifier formed in accordance with FIG. 1.

In contrast, FIG. 5 shows an example output from a real preamplifier in accordance with the present invention, particularly FIG. 1 and set up experimentally. This compensates a possible short overshoot (up-shift) of the base line in order to gain the recognised small events that are nearby larger events. Thus, all of the events can be clearly discerned from one another. In doing so, the preamplifier is able to amplify weak signals and enhances the SEM lifetime of the detector, as the amplification provided by the SEM may be reduced by reducing the voltage applied across it. This thereby increases its lifetime, because the current load on the last dynodes is significantly reduced. Since a discriminator compares signal events against the noise floor of the detection electronics, the benefit of the present invention allows the detection of weak events. Ideally, the discriminator is able to detect pulses regardless of their magnitude, DC offset and other signal variations and offer a digital signal at its output. The digital events are normally counted for a specific time. If the signal event is too weak, it will not be recognised by the discriminator. On the other hand, a noisy environment can degrade pulse detection and performance or a noise burst is recognised as an event and counted incorrectly. In order to enhance signal quality and avoid ground loops, a transformer is desirably inserted at the input of the amplifier. Normally, the amplification of medium or large pulses will corrupt the DC baseline in the millivolt range and prevent recognising small signals shortly after medium or big ones.

Although a specific embodiment has now been described, the skilled person will appreciate that variations and modifications are possible. For example, the preamplifier of the present invention may be used with different kinds of detector, rather than just the plate detection electrode 10 described above. Moreover, alternatives to the transformer 20 are also possible, since a capacitor may be used for example. Transformers are preferred though, because phase-reversal of the signal may be possible, the signal amplitude can be transformed, filtering can be achieved and impedance matching can be implemented. Moreover, the DC supply voltage of the detector is high, likely around 2 kV, which may be difficult to decouple and condition a small signal in the millivolt range with alternatives to a transformer. It will further be appreciated that the internal DC reference voltage 25 can be of a different value from that specified above. The gain of the various stages can also vary depending on the specific application, as can the design of individual stages. Some stages may be combined, although it is considered less advantageous. Additionally or alternatively, specific components can be replaced by equivalents and sometimes omitted entirely. For example, the capacitance 34 is optional.

A PIN diode 45 has been used in the integrative signal shaping circuit 40 above. However, any delay component may be used. For example, other diodes (especially silicon diodes) may function acceptably. Diodes may be placed in series but should be forward biased to provide the delay effect noted herein.

Operational amplifiers have been used in the specific embodiment discussed above (due to their advantageous defined technical specifications), although alternative circuit designs may be considered. For example, the integration stage 40 can be designed using transistors, such as a JFET.

The invention claimed is:

1. A preamplifier for correction of overshoot or undershoot effects present in a signal received from a charged particle detection electrode, the preamplifier being ground-isolated from the charged particle detection electrode and comprising:
   a main amplification stage, configured to receive and amplify the isolated signal;
   a feed-forward stage, configured to generate a compensation signal from the amplified ground-isolated signal, the compensation signal being generated to mirror the overshoot or undershoot effects; and
   an output, arranged to provide an output signal that is a combination of the amplified ground-isolated signal and the compensation signal.

2. The preamplifier of claim 1, further comprising:
   an input stage, configured to receive a detection signal from the charged particle detection electrode and to ground-isolate the preamplifier from the charged particle detection electrode.

3. The preamplifier of claim 2, wherein the input stage comprises a transformer comprising a primary winding arranged to receive the detection signal and a secondary winding inductively coupled to the primary winding and arranged to provide the isolated signal, the transformer thereby ground-isolating the preamplifier from the charged particle detection electrode.

4. The preamplifier of claim 1, wherein the main amplification stage comprises a non-inverting amplifier configuration.

5. The preamplifier of claim 1, wherein the isolated signal comprises a pulse and wherein the feed-forward stage is configured to generate the compensation signal in proportionality to a magnitude and width of the pulse.

6. The preamplifier of claim 5, wherein the feed-forward stage and the output are configured to provide the output signal such that it comprises a pulse corresponding with the pulse of the isolated signal, the pulse of the output signal being no wider than the pulse of the isolated signal.

7. The preamplifier of claim 1, wherein the feed-forward stage comprises:
   an integrator, configured to receive the amplified isolated signal and to generate an integration signal by integrating the amplified isolated signal over time.

8. The preamplifier of claim 7, wherein the integrator comprises an amplifier with negative feedback, having a capacitor and a diode in its feedback loop.

9. The preamplifier of claim 8, wherein the diode is a PIN diode.

10. The preamplifier of claim 8, wherein the integrator comprises:
    an operational amplifier in an inverting configuration; and
    wherein the capacitor and PIN diode are arranged to provide negative feedback to the operational amplifier.

11. The preamplifier of claim 7, wherein the feed-forward stage further comprises:
    an inverting amplifier, arranged to receive the integration signal and to generate the compensation signal by amplification of the integration signal.

12. The preamplifier of claim 1, wherein the output comprises:
    a summing junction, configured to receive the amplified isolated signal through a first resistance, to receive the compensation signal through a second resistance and to provide the output signal by summing the received signals; and
    wherein the first and second resistances are selected in order to cause the summation of the amplified isolated signal and the compensation signal to correct the overshoot or undershoot effects present in the isolated signal.

13. The preamplifier of claim 1, wherein the isolated signal is referenced to a non-zero DC voltage.

14. A charged particle detection arrangement, comprising:
    a charged particle detection electrode, arranged to provide a detection signal; and
    a preamplifier for correction of overshoot or undershoot effects present in the detection signal, the preamplifier being ground-isolated from the charged particle detection electrode and comprising:
a main amplification stage, configured to receive and amplify the isolated detection signal;
a feed-forward stage, configured to generate a compensation signal from the amplified ground-isolated detection signal, the compensation signal being generated to mirror the overshoot or undershoot effects; and
an output, arranged to provide an output signal that is a combination of the amplified ground-isolated detection signal and the compensation signal.

15. A method for correction of overshoot or undershoot effects present in a signal received from a charged particle detection electrode at a ground-isolated preamplifier, the method comprising:
amplifying the isolated signal;
generating a compensation signal from the amplified isolated signal to mirror the overshoot or undershoot effects; and
combining the amplified isolated signal and the compensation signal in order to provide an output signal that is corrected for the overshoot or undershoot effects.

* * * * *